US008536526B2

(12) United States Patent
Bell et al.

(10) Patent No.: US 8,536,526 B2
(45) Date of Patent: Sep. 17, 2013

(54) METHODS OF OPERATING A NANOPROBER TO ELECTRICALLY PROBE A DEVICE STRUCTURE OF AN INTEGRATED CIRCUIT

(75) Inventors: Paul D. Bell, Colchester, VT (US); Mark E. Masters, Essex Junction, VT (US); David S. Patrick, Colchester, VT (US)

(73) Assignee: International Business Machines Corporation, Armonk, NY (US)

( * ) Notice: Subject to any disclaimer, the term of this patent is extended or adjusted under 35 U.S.C. 154(b) by 651 days.

(21) Appl. No.: 12/344,651

(22) Filed: Dec. 29, 2008

(65) Prior Publication Data
US 2010/0163727 A1  Jul. 1, 2010

(51) Int. Cl.
*G01N 23/00* (2006.01)
(52) U.S. Cl.
USPC .............................. 250/307; 250/306; 250/310
(58) Field of Classification Search
USPC ................................................... 250/307
See application file for complete search history.

(56) References Cited

U.S. PATENT DOCUMENTS

| 5,616,921 | A | 4/1997 | Talbot et al. | |
|---|---|---|---|---|
| 6,433,561 | B1 * | 8/2002 | Satya et al. | 356/237.5 |
| 6,583,413 | B1 | 6/2003 | Shinada et al. | |
| 6,621,282 | B2 | 9/2003 | Hollman | |
| 6,744,268 | B2 * | 6/2004 | Hollman | 324/750.14 |
| 7,075,077 | B2 | 7/2006 | Okuda et al. | |
| 7,109,483 | B2 * | 9/2006 | Nakasuji et al. | 250/310 |
| 7,230,240 | B2 * | 6/2007 | Siebert et al. | 250/306 |
| 7,232,997 | B2 | 6/2007 | Edinger et al. | |
| 7,285,781 | B2 | 10/2007 | Cao et al. | |
| 7,297,945 | B2 | 11/2007 | Hazaki et al. | |
| 7,310,585 | B2 | 12/2007 | Brodsky et al. | |
| 7,700,916 | B2 * | 4/2010 | Ando et al. | 250/310 |
| 2005/0140379 | A1 | 6/2005 | Furukawa et al. | |
| 2008/0224039 | A1 | 9/2008 | Nakamura et al. | |

FOREIGN PATENT DOCUMENTS

| EP | 1271605 A1 | 1/2003 |
|---|---|---|
| EP | 1566647 A1 | 8/2005 |

OTHER PUBLICATIONS

Deben UK Limited, "PCD Port Beam Blanking System", product brochure Mar. 2005, 1 page.

(Continued)

*Primary Examiner* — Phillip A Johnston
(74) *Attorney, Agent, or Firm* — Wood, Herron & Evans LLP; Anthony J. Canale

(57) ABSTRACT

Methods for nanoprobing a device structure of an integrated circuit. The method may include scanning a primary charged particle beam across a first region of the device structure with at least one probe proximate to the first region and a second region of the device structure is masked from the primary charged particle beam. The method may further include collecting secondary electrons emitted from the first region of the device structure and the at least one probe to form a secondary electron image. The secondary electron image includes the first region and the at least one probe as imaged portions and the second region as a non-imaged portion. Alternatively, the second region may be scanned by the charged particle beam at a faster scan rate than the first region so that the second region is also an imaged portion of the secondary electron image.

21 Claims, 5 Drawing Sheets

(56) References Cited

OTHER PUBLICATIONS

Doering, et al., "Investigation on the Influence of Focused Electron Beam on Electrical Characteristics of Integrated Devices", Proceedings of the 33rd International Symposium for Testing and Failure Analysis, Nov. 2007, San Jose, CA, pp. 210-213.

Jeol, "JCM-5700 Scanning Electron Microscope CarryScope", product brochure 2006-2007, 1 page.

Stallcup, et al. "Bit Cell Stability Testing Using an Encoded 8-Positioner SEM Nanoprobing System", Zyvex Instruments, LLC Technical Paper 2007, pp. 1-4.

European Patent Office, Search Report and Written Opinion issued in related International application No. PCT/EP2009/066698 dated Mar. 24, 2010.

* cited by examiner

METHODS OF OPERATING A NANOPROBER TO ELECTRICALLY PROBE A DEVICE STRUCTURE OF AN INTEGRATED CIRCUIT

BACKGROUND

The invention relates generally to integrated circuit fabrication and, in particular, to methods for operating a nanoprober to electrically probe device structures of an integrated circuit.

Specialized electron beam instruments, known as SEM nanoprobers, consist of a scanning electron microscope (SEM) and a set of probes disposed inside the SEM vacuum chamber. Secondary electron images from the SEM are used to position the probes relative to a device structure of an integrated circuit that is to be electrically tested. The probes are used to electrically characterize the device structure. Nanoprobing is capable of directly measuring basic transistor parameters such as threshold voltage ($V_t$), off state leakage current ($I_{off}$), saturation current ($I_{sat}$), and junction behavior by means of current/voltage (I/V) curve measurements. Among other applications, these electrical measurements may be useful in performing root cause failure analysis of defective device structures.

The probes and device contacts are real-time imaged with the SEM to land the probes and then to monitor future probe behavior while the electrical measurements are executed. The electron dose, or total charge of electrons per unit area, deposited in the device structure under testing is proportional to the beam current, the exposure time, and the scanned surface area through the magnification. To combat alteration of the device electrical characteristics from electron beam exposure, characteristics of the electron beam, such as accelerating voltage, magnification, and beam current, are minimized. However, these operating characteristics must be maintained above a threshold capable of inducing enough secondary electron emission to permit adequate imaging of the probes and the device structure under testing.

As the probes land on the device contacts, the probes will typically settle in the Z-direction, which may cause the submicron probe tips to shift in a lateral (X-Y) direction relative to the contacts. The lateral shifting can bend the probe, which may result in damage to the probe tip or to the device under testing. The probe may also slide off the contact, which results in a loss of electrical continuity. To monitor for lateral shifting, the instrument user monitors each probe with secondary electron imaging. If needed, the instrument user adjusts the pressure of the probe tips while landing on the contacts and often during the subsequent electrical measurement to combat building pressure. The instrument user can note pressure building on a probe by observing increases in the arc or bend of the probe shank or actual lateral motion of the probe tip in the secondary electron image and take corrective actions as needed.

The primary electron beam of the SEM must be scanned across the sample at a slow speed and with a high magnification to permit the instrument user to detect lateral probe movement in the secondary electron image. Unfortunately, slow speed, high magnification imaging with the primary electron beam increases the electron dose absorbed by the device structure, which can unfortunately alter the electrical characteristics. The accumulating electron beam dose also causes sample charging, which reduces the resolution and quality of the secondary electron image.

One conventional solution for alleviating the problems associated with accumulating electron beam dose is to fully blank the primary electron beam after touchdown of the probes on the contacts and during the electrical measurement. In this drastic approach, one instance of a targeted device structure is probed with slow speed, high magnification imaging and without regard to electron dose alterations in electrical characteristics. Then, retaining the same spatial arrangement for the probes and with the beam blanked, the sample stage is precisely stepped to other instances of the device structure and the probes are blindly lowered to establish contacts without imaging. The electrical measurement is then executed in the absence of any imaging with the SEM.

Full beam blanking reduces the beam exposure but completely suspends secondary electron imaging. If sudden movement occurs as a result of building pressure, the probe may deform and bend. Without real time imaging, bent probes cannot be detected until after the conclusion of the probing session when imaging is re-initiated. By then, the probe may be irreversibly damaged or shorted probes may have destroyed the device structure under testing.

As shrinking technology nodes lead to thinner films and smaller device features, mere optimization of the beam characteristics of the SEM used by the nanoprober may prove inadequate. Specifically, imaging with conventional optimized conditions may not be adequate to accurately land the probes on the contacts and, at the same time, to ensure that the electrical characteristics of the device structure under testing do not shift as a result of electron beam exposure. Conventional SEM nanoprobers have reached equipment limits of beam optics as far as the ability to further reduce the accelerating voltage and beam current of the primary electron beam. In addition, full beam blanking is not a viable solution because the smaller probe tips needed at smaller technology nodes are even more prone to lateral movement.

What is needed, therefore, are improved methods for reducing the electron beam irradiation of sensitive regions of a device structure, especially those device structures fabricated with smaller technology nodes, during a probing session in an SEM nanoprober.

BRIEF SUMMARY

In an embodiment of the invention, a method is provided for nanoprobing a device structure on a sample using at least one probe. The method includes positioning the at least one probe relative to a first region and a second region of the device structure and scanning a charged particle beam across the first region and the at least one probe. As the primary charged particle beam is scanned across the first region, the second region of the device structure is masked from exposure to the primary charged particle beam. The method further includes collecting secondary electrons emitted from the first region of the device structure and the at least one probe to form a secondary electron image. The secondary electron image includes the first region and the at least one probe as imaged portions and the second region as a non-imaged portion.

In another embodiment of the invention, a method is provided for nanoprobing a device structure on a sample using at least one probe. The method includes positioning the at least one probe relative to a first region of the device structure and a second region of the device structure, scanning a primary charged particle beam across the first region of the device structure at a first scan rate, and scanning the primary charged particle beam across the second region of the device structure at a second scan rate faster than the first scan rate. Secondary electrons emitted from the first and second regions of the device structure and the at least one probe are collected to form a secondary electron image of the sample. The secondary electron image includes the first and second regions and the at least one probe as imaged portions.

BRIEF DESCRIPTION OF THE SEVERAL VIEWS OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention.

DETAILED DESCRIPTION

The various embodiments of the invention present preventative measures that reduce the exposure of device regions sensitive to electron beam irradiation and, thereby, mitigate any associated electrical degradation of the device structure during a probing session in an SEM nanoprober, as well as in other nanoprobers that image with other types of charged particles. As a result of the practice of these embodiments, conventional electron beam characteristics may be utilized that are adequate for imaging and still ensure device electrical integrity. The embodiments of the invention provide techniques for masking sensitive regions on the device structure under testing from electron beam exposure while maintaining the ability to land the probes on the device contacts or terminals. As a result, a reduced electron dose is delivered to sensitive device regions during the probing session, which promotes more accurate measurements of electrical characteristics and reduces beam induced device alteration.

Figure 1:
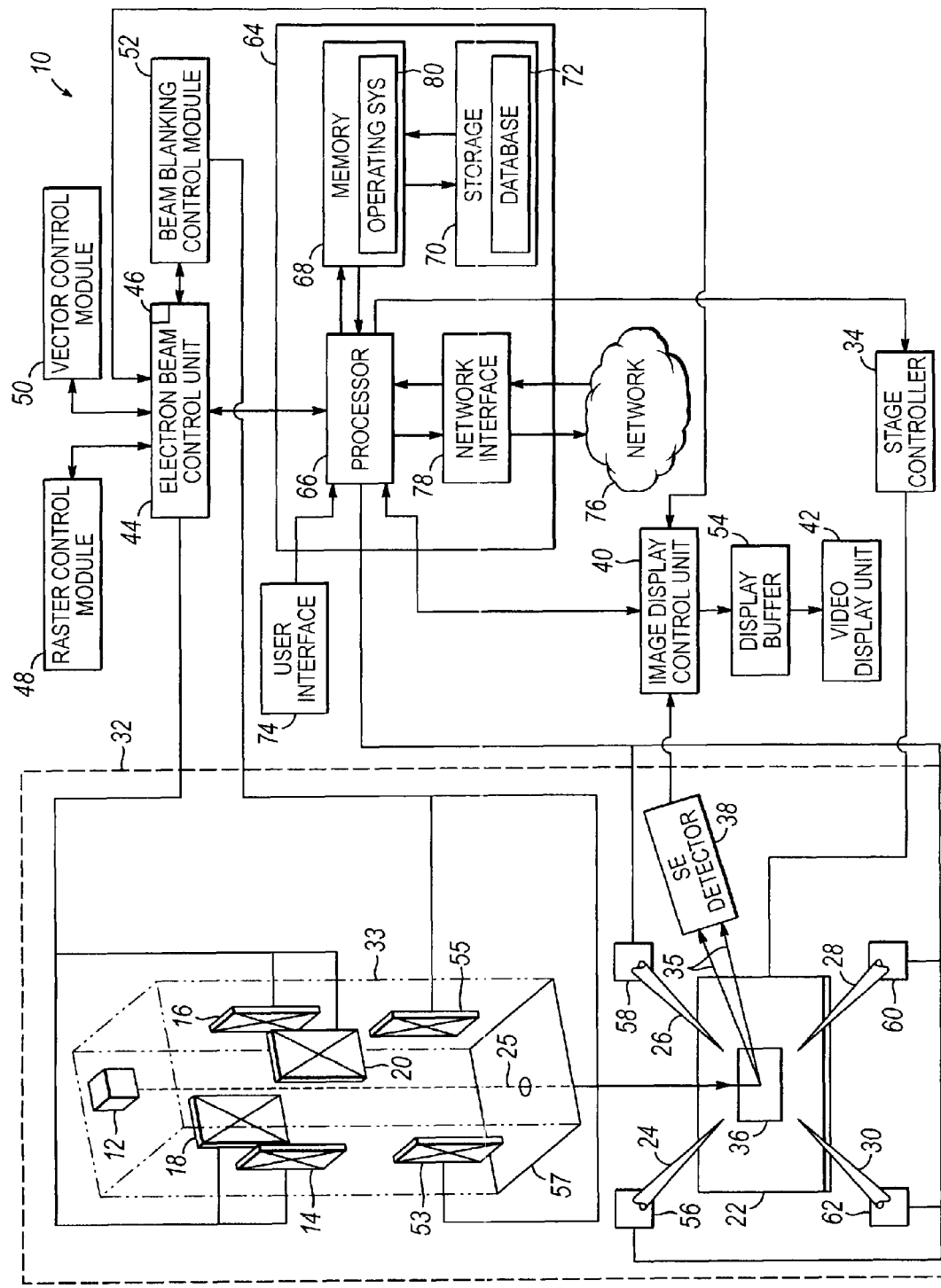
FIG. 1 is a diagrammatic view of an SEM nanoprober in accordance with an embodiment of the invention.

With reference to FIG. 1 and in accordance with an embodiment of the invention, a scanning electron microscope (SEM) nanoprober 10 includes an electron gun 12, a set of scan coils 14, 16, another set of scan coils 18, 20, a sample stage 22, and a set of probes 24, 26, 28, 30 that are housed inside a vacuum chamber 32. The electron gun 12 includes an anode and cathode (not shown) to which an accelerating voltage is applied to create a relatively large potential difference that extracts an emission current from the cathode and, thereby, generate a primary electron beam 25 by either field emission or thermionic emission. Located inside the vacuum chamber 32 of the SEM nanoprober 10 is a column 33 that features various condenser lenses, objective lenses, and apertures, which collectively operate as electron optics that focus and collimate the primary electron beam 25 in the travel path from the electron gun 12 to the sample stage 22. The scan coils 14, 16, 18, 20 are also located inside the vacuum chamber 32. The sample stage 22 is movable under the management of a stage controller 34 to situate different regions of interest on a sample 36 within the field of view of the primary electron beam 25. The sample 36 may be a die carrying an integrated circuit, which has been prepared for electrical probing in the SEM nanoprober 10 to perform root cause failure analysis. Alternatively, the sample 36 may be a wafer carrying multiple product chips.

Although described herein in relation to the use of a primary electron beam 25, a person having ordinary skill in the art will appreciate that the embodiments of the invention may also apply to the use of a focused ion beam containing positive ions, or another type of focused charged particle beam, in conjunction with nanoprobing. A person having ordinary skill in the art will understand the modifications to the SEM nanoprober 10 required to convert the tool for use with other types of charged particles, such as positive ions.

The scan coils 14, 16, 18, 20 are disposed within the column 33 between the electron gun 12 and the sample stage 22. The scan coils 14, 16, 18, 20 are energized to scan the primary electron beam 25 in two dimensions across a region of interest on the surface of the sample 36. To that end, one set of scan coils 14, 16 is configured to deflect the primary electron beam 25 relative to the surface of the sample 36 in a first direction and the other set of coils 18, 20 is configured to deflect the primary electron beam 25 relative to the surface of the sample 36 in a second direction orthogonal to the first direction.

When irradiated by the primary electron beam 25, secondary electrons 35 are emitted from the sample 36. The secondary electrons 35 are produced by interactions of the primary electron beam 25 with atoms at, or near, the surface of the sample 36. The secondary electrons 35 are collected by a secondary electron detector 38 located inside the vacuum chamber 32. Typically, the secondary electron detector 38 includes a phosphor or scintillator that converts the collected secondary electrons 35 into flashes of light and a photomultiplier that converts these flashes of light into amplified electrical signals. The secondary electron detector 38 is positively biased to attract the secondary electrons 35.

The amplified electrical signal output from the secondary electron detector 38 is converted by an image display control unit 40 to video signals, which are supplied to a video display unit 42 for display as a secondary electron image of a field of view on the sample 36. The secondary electron image contains a two-dimensional intensity distribution or map of the secondary electron emission prompted by the interaction of the primary electron beam 25 with the surface of the sample 36. The intensity of the individual pixels in the secondary electron image displayed on the video display unit 42 depends on the number of secondary electrons 35 from the corresponding location on the sample 36 that reach the secondary electron detector 38. Alternatively, secondary electron image from the sample 36 may be digitized into discrete pixels before display on the video display unit 42 and saved in a digital format in the storage 70 of the controller 64. The number of secondary electrons 35 emitted from any point on the sample 36 depends on the type of material exposed to the primary electron beam 25.

The travel path of the primary electron beam 25 passes through the scan coils 14, 16, 18, 20 in the column 33 of the SEM nanoprober 10. The scan coils 14, 16, 18, 20 cooperate to deflect the primary electron beam 25 in the x- and y-axes so that, downstream from the scan coils 14, 16, 18, 20, the primary electron beam 25 scans in a pre-set pattern relative to a surface area on the sample 36. An electron beam control unit 44 is configured to monitor and control deflection of the primary electron beam 25 by the scan coils 14, 16, 18, 20 with applied excitation voltages. To that end, the electron beam control unit 44 is configured to generate the preset pattern by enabling raster scans of the primary electron beam 25, vector scans of the primary electron beam 25, beam dwell or sweep timings, and beam blanking.

The SEM nanoprober 10 includes various control modules that are used to control and manage the primary electron beam 25, as well as operation of the sample stage 22, secondary electron imaging, and electrical probing. For raster scans, the scan coils 14, 16, 18, 20 may be supplied with a two-dimensional scan signal having an amplitude corresponding to the final magnification from a scan signal generator circuit 46 in the electron beam control unit 44. A raster control module 48 of the electron beam control unit 44 is configured to indicate a starting corner of a raster set, a sweep rate (or a dwell and a step rate), initial and terminal positions of the raster scan lines, the spacing between successive raster scan lines, and the height of raster boxes to the scan signal generator circuit 46. A vector control module 50 of the electron beam control unit 44 is configured to indicate a vector start point, a vector direction, a vector terminal point, and a sweep rate for vector scan lines of the primary electron beam 25 to the scan signal generator circuit 46.

A beam blanking control module 52 of the electron beam control unit 44 is configured to set start and stop locations for blanking of the primary electron beam 25 when moved across the sample 36 in either raster scans or vector scans. The beam blanking control module 52 may apply a voltage to a set of deflection plates 53, 55 to deflect the primary electron beam 25 laterally onto a downstream aperture stop 57 in the column 33, thereby blanking the beam 25 so that the primary electrons are not incident on the sample 36. The primary electron beam 25 is restored by removing the voltage from the deflection plates 53, 55 so that the primary electron beam 25 again permitted to travel to the sample 38 through an opening in the aperture stop 57. When the beam blanking control module 52 is operated to blank the primary electron beam 25, the secondary electron emission from the sample 36 ceases as the primary electron beam 25 is blocked from traveling to the sample 36.

In a raster scanning mode, the movement of the primary electron beam 25 across the sample 36 is divided into a sequence of horizontal strips known as scan lines. Each of the scan lines is implemented by causing the scan signal generator circuit 46 in the electron beam control unit 44 to operate the scan coils 14, 16, 18, 20 to deflect the primary electron beam 25 at fixed increments (or as a continuous sweep) along a linear path parallel to one axis from a start point to an end point. The primary electron beam 25 is permitted to dwell for a fixed dwell time at each intervening point between the start and end points. At the end point of each scan line, the position of the primary electron beam 25 is incrementally advanced along a second axis orthogonal to the first axis. The primary electron beam 25 may return to the start point of the first axis to initiate the net successive scan line, or the primary electron beam 25 may be deflected in the reverse direction from the end point back toward the start point. This process continues until all raster scan lines have been traced on the sample 36 and the primary electron beam 25 has dwelled at all points in each scan line.

The image display control unit 40 of the SEM nanoprober 10 manages the operation of the video display unit 42. The secondary electron image 94 (FIG. 3) is periodically refreshed on the video display unit 42. The image display control unit 40 closely synchronizes the secondary electron image 94 displayed on the video display unit 42, or stored in a display buffer 54 and periodically forwarded to the video display unit 42, with the deflections of the primary electron beam 25 caused by the electron beam control unit 44 and scan coils 14, 16, 18, 20. The resulting secondary electron image 94 on the video display unit 42 is therefore a distribution map of the intensity of secondary electrons 35 being emitted from the scanned area on the sample 36 and is intimately linked thereto.

The image display control unit 40 has the capability to superimpose operator defined mask regions, zones, or a CAD layout on the secondary electron image 94 on the video display unit 42 and capture such operator-defined information for control of the electron beam by the electron beam control unit 44. The image display control unit 40 includes a compensation control for SEM magnification to scale images for the electron beam field of view and to scale masks, zones, or CAD layout. The image display control unit 40 includes the capacity to block the secondary electron image intensity signal to the video display unit 42 or display buffer 54 for spatial coordinates correlating to a masked region on the sample 36, which is implemented with regard to the primary electron beam 25 by the beam blanking control module 52.

Using the secondary electron image 94, the probes 24, 26, 28, 30 are maneuvered by motorized micromanipulators 56, 58, 60, 62 to position the tips of the probes 24, 26, 28, 30 in direct contact with conductive features on the sample 36. During this positioning process, the location of the contacts on the sample 36 and, optionally, the real-time position of the probes 24, 26, 28, 30 are monitored using the secondary electron image 94. When the tips of the probes 24, 26, 28, 30 are properly positioned, electrical test signals are directed from the probes 24, 26, 28, to the conductive features on the sample 36. As appreciated by a person having ordinary skill in the art, the exact number of probes 24, 26, 28, 30 associated with the SEM nanoprober 10 may differ from the representative number depicted in FIG. 1, and may range from one (1) to eight (8), or even more than eight, according to the type of electrical test measurement.

The operation of the SEM nanoprober 10 is coordinated and controlled by a controller 64, which is electrically coupled with stage controller 34, image display control unit 40, and electron beam control unit 44. The controller 64 includes a processor 66 and a memory 68 coupled with the processor 66. Processor 66 may represent one or more individual processors (e.g., microprocessors), and memory 68 may represent the random access memory (RAM) devices comprising the main storage of controller 64, as well as any supplemental levels of memory, e.g., cache memories, non-volatile or backup memories (e.g., programmable or flash memories), read-only memories, etc. In addition, memory 68 may be considered to include memory storage physically located elsewhere in controller 64, e.g., any cache memory in the processor 66, as well as any storage capacity used as a virtual memory, e.g., as stored on a mass storage device 70. The mass storage device 70 may contain a cache or other data storage, which may include one or more databases 72. The databases 72 may, for example, contain CAD navigation data and CAD layout data for use in practicing embodiments of the invention.

Controller 64 also typically receives a number of inputs and outputs for communicating information externally. For interfacing with a user or operator, controller 64 typically includes a graphical user interface 74 with one or more input devices, such as a keyboard, a mouse, a trackball, a joystick, a touchpad, a keypad, a stylus, and/or a microphone, among others, as well a display, such as a CRT monitor, an LCD display panel, and/or a speaker, among others, or other type of output device, such as a printer. The interface to controller 64 may also be through an external terminal connected directly or remotely to controller 64, or through another computer communicating with controller 64 via a network 76, modem, or other type of recognized communications device. Controller 64 communicates on the network 76 through a network interface 78.

Controller 64 operates under the control of an operating system 80 and executes or otherwise relies upon various computer software applications, components, programs, objects, modules, data structures, etc. In general, the routines executed to implement the embodiments of the invention, whether implemented as part of an operating system or a specific application, component, program, object, module or sequence of instructions will be referred to herein as "computer program code", or simply "program code". The computer program code typically comprises one or more instructions that are resident at various times in various memory and storage devices in a computer, and that, when read and executed by one or more processors in a computer, causes that computer to perform the steps necessary to execute steps or elements embodying the various aspects of the invention.

The SEM nanoprober 10 may provide a user with the ability to program the controller 64 with instructions and settings for the various embodiments used to mask sensitive regions of the device structure from exposure to the primary electron beam 25. For example, the user may supply instructions for the masking operations to the controller 64 via the user interface 74. Alternatively, the instructions for the masking operation may be received remotely, such as from another computer that is operatively coupled to controller 64 through network 76, for example.

Figure 2:
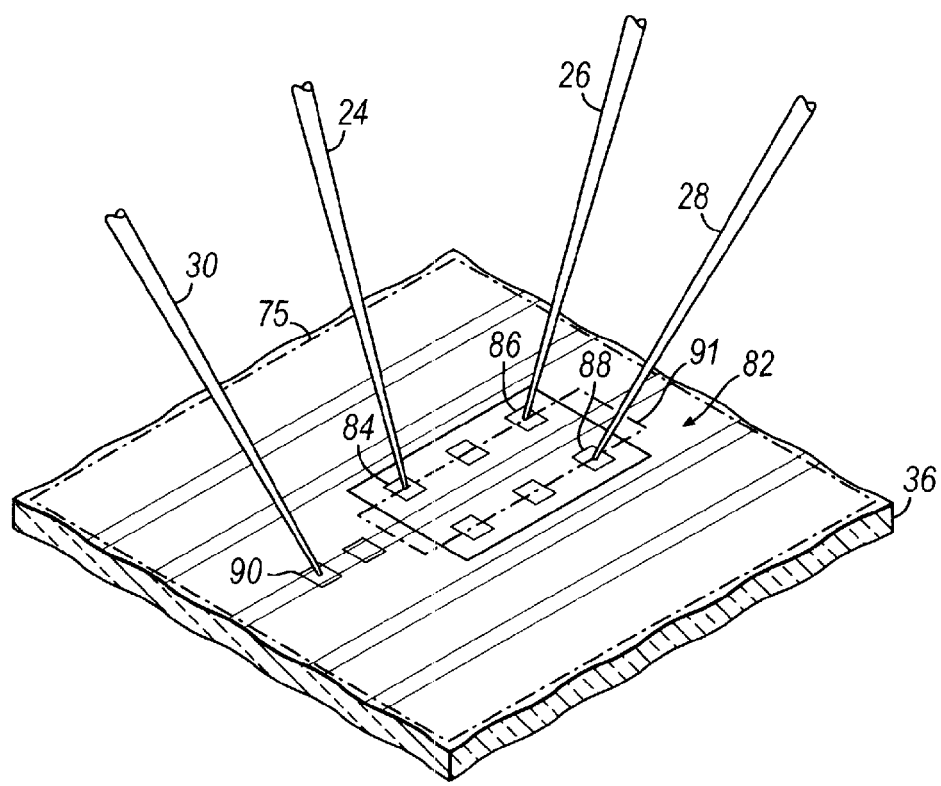
FIG. 2 is a diagrammatic perspective view of a portion of a device structure at the contact level with the probe tips landed on the contacts for performing an electrical measurement.
Figure 3:
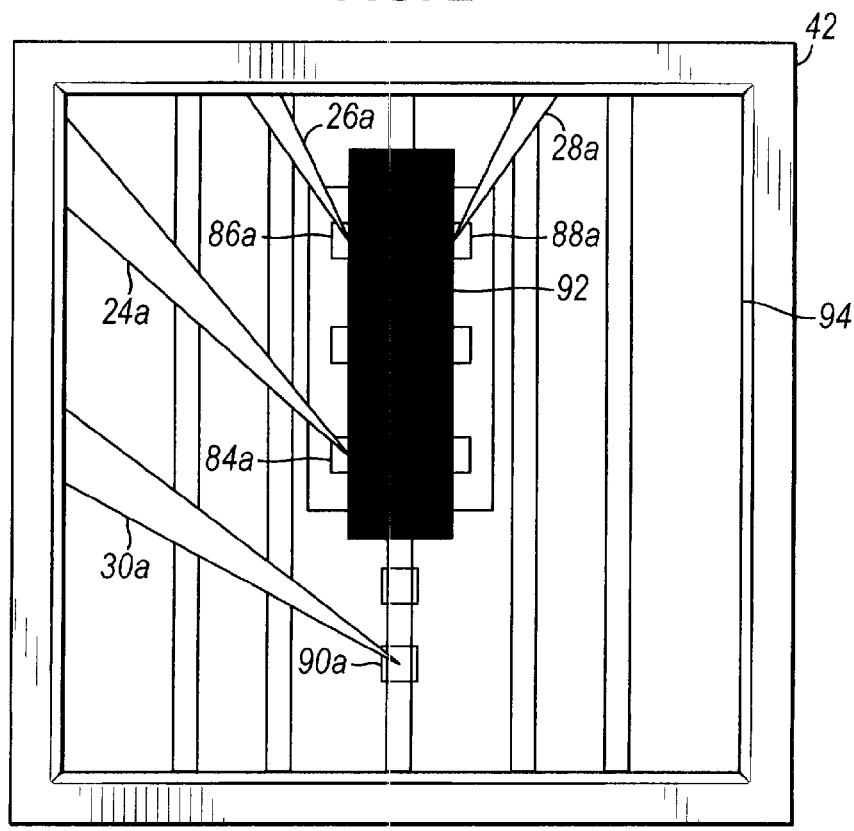
FIG. 3 is a diagrammatic view of a secondary electron image of the device structure of FIG. 2 with a masked sensitive region defined in accordance with an embodiment of the invention.

With reference to FIGS. 2 and 3 and in accordance with an embodiment of the invention, the operation of the SEM nanoprober 10 is illustrated during a probing session conducted at the contact (CA) level of a device structure, which is generally indicated by reference numeral 82, on the sample 36. The device structure 82 may be, for example, a field effect transistor or a memory cell containing several field effect transistors. The tips of the probes 24, 26, 28, 30 are placed in contact with the terminals or contacts 84, 86, 88, 90 of the CA level for electrically characterization of the device structure 82 that is the device under testing.

During the probing session, the beam blanking control module 52 of the electron beam control unit 44 is used to prevent the primary electron beam 25 from irradiating a masked region 91 (FIG. 3) on the sample 36 that coincides spatially with a sensitive region of the device structure 82 utilizing beam blanking. The sensitive region may be, for example, a gate stack region of the device structure 82. However, the probes 24, 26, 28, 30 and at least a portion of the contacts 84, 86, 88, 90 are continuously exposed to the secondary electron beam 25, as apparent in FIG. 2, within a field of view 75 and are visible as probes 24a, 26a, 28a, 30a and contacts 84a, 86a, 88a, 90a in the secondary electron image 94 displayed on the video display unit 42, as apparent in FIG. 3.

The raster control module 48 of the electron beam control unit 44 is used to implement raster scanning of the primary electron beam 25 over a region of interest that encompasses the device structure 82 constituting the device under testing and the contacts 84, 86, 88, 90. Initially, the image magnification is set at a low value. While imaging at the low magnification, the region of interest on the sample 36 containing the device structure 82 is quickly located. An initial secondary electron image (not shown) is captured at the low magnification and displayed on the video display unit 42. The exposure time and low electron flux required to capture the low magnification image are kept beneath a threshold for altering the electrical characteristics of the device structure 82. Through the user interface 74, the instrument user defines the masked region 91 to coincide with the sensitive region of the device structure 82.

The image magnification is increased to a higher value, and the location of the primary electron beam 25 may be laterally shifted, to position the probes 24, 26, 28, 30 relative to the device structure 82 and eventually place the tips of the probes 24, 26, 28, 30 on the contacts 84, 86, 88, 90. During the probing session and while at the high magnification, the primary electron beam 25 is scanning across a surface area of the sample 36 constituting the field of view 75. The masked region 91 is implemented within the field of view 75 by timing the operation of the beam blanking control module 52 with the excitation of the scan coils 14, 16, 18, 20. The controller 64 monitors the signals for the scan coils 14, 16, 18, 20 supplied from the scan signal generator circuit 46 in the electron beam control unit 44 and activates the beam blanking control module 52 to blank the primary electron beam 25 for portions of those raster scan lines across the field of view 75 that intersect the masked region 91 and would lie inside the masked region 91 but for beam blanking.

For each individual raster scan line, the controller 64 detects from the scan coils 14, 16, 18, 20 when the position of the primary electron beam 25 is about to intersect one edge of the masked region 91. At the initial edge of the masked region 91 on the sample 36, the controller 64 blanks the primary electron beam 25, which masks the masked region 91 against exposure to the primary electron beam 25. To that end, the controller 64 instructs the beam blanking control module 52 to apply a voltage to the deflection plates 53, 55 so that the primary electron beam 25 is laterally deflected to strike the aperture stop 57.

The controller 64 maintains the primary electron beam 25 in the blanked state until the controller 64 senses from the voltages supplied to the scan coils 14, 16, 18, 20 that the position of the primary electron beam 25, while blanked, is about to intersect the opposite edge of the masked region 91. The controller 64 deactivates the beam blanking control module 52 to permit the primary electron beam 25 to impinge the probes 24, 26, 28, 30 and the sample 36 in the field of view 75 outside of the masked region 91. Alternatively, the controller 64 may also perform beam blanking with the scan coils 14, 16, 18, 20 alone by moving the primary electron beam 25 outside of the region of interest or beyond the opening in the aperture stop 57. Raster scanning continues to the terminal end of each raster scan line, at which point the raster scan and blank process is repeated with the next successive raster scan line.

The contacts 84, 86, 88, 90 and the probes 24, 26, 28, 30 remain exposed to the primary electron beam 25 within the field of view 75 and emit secondary electrons. As mentioned above, the image display control unit 40 and video display unit 42 are linked with the raster scan lines of the primary electron beam 25. As a result, at least a portion of each of the contacts 84*a*, 86*a*, 88*a*, 90*a* and the probes 24*a*, 26*a*, 28*a*, 30*a* are continuously imaged in the secondary electron image 94 (FIG. 3) of the sample 36 processed by the image display control unit 40 and displayed on the video display unit 42. Because the primary electron beam 25 is blanked over the masked region 91 that coincides with the sensitive region of the device structure 82, secondary electrons are not emitted from region 91 on the sample 36. In the absence of secondary electron emission, the masked region 91 appears as a non-imaged region 92 embedded within the secondary electron image 94.

With each magnification increment, the dimensions of the masked region 91 are scaled with the magnification changes instituted by the controller 64 to maintain registration of the masked region 91 with the sensitive region of the device structure 82. The scaling can be accomplished by utilizing a reference point, such as a center of the electron beam scan, for the masked region 91 and scaling the dimensions of the masked region 91 proportionally with any magnification change while retaining the reference point. The masked region 91 is automatically adjusted by the controller 64, as needed, for varying magnifications to optimize imaging of the non-masked contacts 84, 86, 88, 90 and yet continuously protect the sensitive region of the device structure 82. Any beam-shift operations occurring while imaging are accommodated by adjusting the reference point for the masked region 91 by a displacement equivalent to the magnitude of the beam shift. With changes in image magnification, the size of the masked region 91 may be adjusted by the instrument user.

In an alternative embodiment of the invention, the field of view 75 may be imaged exclusively with vector scan lines rather than raster scan lines. The vector control module 50 is used in conjunction with the electron beam control unit 44 to provide appropriate excitation voltages to the scan coils 14, 16, 18, 20 to generate the vector scan lines. Specifically, a plurality of vector scan lines are defined to cover the field of view 75 while excluding the masked region 91, and implemented using the vector control module 50 of the electron beam control unit 44. For each individual vector in the vector set, a vector start point and a vector end point is established for use by the vector control module 50. A vector sweep rate and a vector density are also established for use by the vector control module 50 to provide a secondary electron signal of sufficient intensity to generate a secondary electron image with adequate resolution to identify the contacts 84*a*, 86*a*, 88*a*, 90*a* and the probes 24*a*, 26*a*, 28*a*, 30*a* in the secondary electron image 94 processed by the image display control unit 40 and displayed on the video display unit 42.

The masked region 91 is defined, as described with regard to FIGS. 2 and 3, to coincide with the sensitive region of the device structure 82. The definition of the vector lines scans the field of view 75 with the primary electron beam 25, but avoids the masked region 91 so that sensitive region of the device structure 82 is masked from exposure to the primary electron beam 25. The scan coils 14, 16, 18, 20 are excited by voltages from the scan signal generator circuit 46 in the electron beam control unit 44 only at those addresses corresponding to the field of view 75. The scan coils 14, 16, 18, 20 are not excited by voltages from the scan signal generator circuit 46 for those addresses corresponding to the masked region 91, which are not found in the vectors for the primary electron beam 25.

The image display control unit 40 and display buffer 54 are synchronized with the vectoring of the primary electron beam 25 on the sample 36. The vector scan lines for the primary electron beam 25 are continuously repeated or looped so that the image display control unit 40 can continuously update the display buffer 54. The secondary electron image 94 displayed on the video display unit 42 is continuously refreshed from the display buffer 54 so that the secondary electron image 94 from the field of view 75 is continuously displayed. The appearance of the secondary electron image 94 displayed on the video display unit 42 is as shown in FIG. 3 and includes the embedded non-imaged region 92.

If needed, the controller 64 may use the beam blanking control module 52 of the electron beam control unit 44 to optionally blank the primary electron beam 25 as beam 25 is vectored among the different vector scan lines. The beam blanking of portions of each of the vector scan lines on the sample 36 that intersect the masked region 91 prohibits the primary electron beam 25 from entering the masked region 91. Of course, each of the vector scan lines may be chosen with a start point and an end point within the field of view 75 on the sample 36 such that the primary electron beam 25 does not enter the masked region 91 when moved along any of the vector scan lines.

Figure 4:
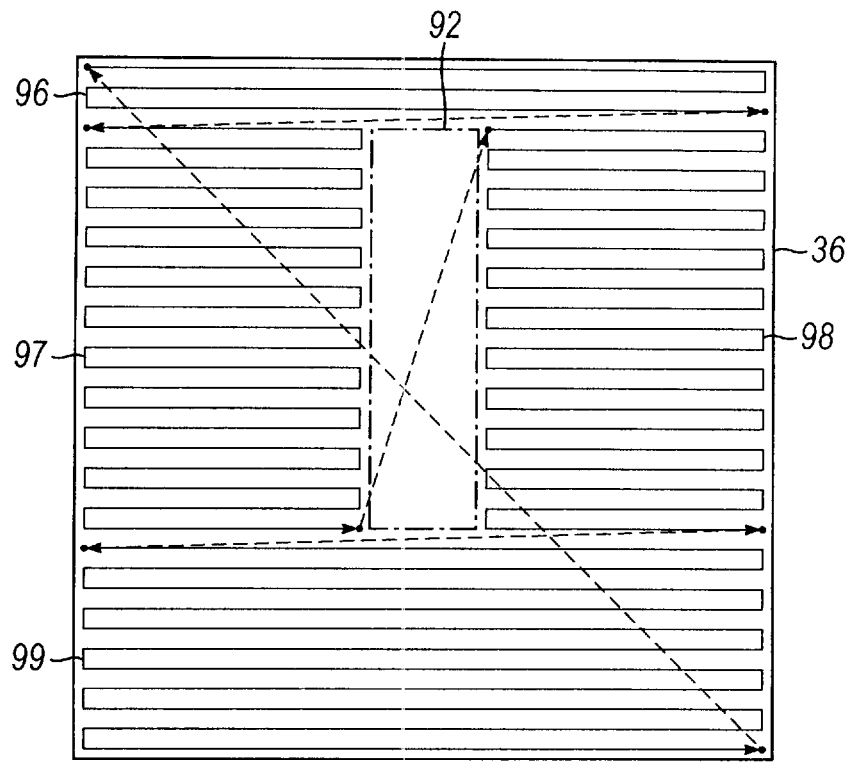
FIG. 4 is a schematic top view of the sample surface illustrating the use of a combination of vector scanning and raster scanning of the primary electron beam on the sample to generate the secondary electron image of FIG. 3 in accordance with an alternative embodiment of the invention.

With reference to FIG. 4 and in accordance with an alternative embodiment of the invention, the use of the masked region 91 on the sample 36 may also be used in conjunction with a combination of vector scans and raster scans of the primary electron beam 25 to protect the sensitive region of the device structure 82 while imaging the probes 24, 26, 28, 30 and the contacts 84, 86, 88, 90. Specifically, the field of view 75 is partitioned into a set of rectangular fields or sub-regions 96-99 and the primary electron beam 25 is vectored among the different sub-regions 96-99. After vectoring the primary electron beam 25 from a vector start point to a vector end point, each of the sub-regions 96-99 is successively imaged with a raster scan. Each vector end point coincides with the starting corner of the raster scan for one of the sub-regions 96-99.

The masked region 91 is defined, as described with regard to FIGS. 2 and 3, to coincide with the sensitive region of the device structure 82. A beam vector set is defined by the controller 64. The beam vector set is calculated to move the primary electron beam 25 relative to the sample 36 so that raster scans can be implemented within each of the sub-regions 96-99. The masked region 91 is then used by the controller 64 to define a starting corner of the raster set for each of the sub-regions 96-99, a sweep rate (or a dwell and a step rate for incremental movement), an initial position of each scan line in the sub-regions 96-99, a terminal position of each scan line in the sub-regions 96-99, and a height for each of the sub-regions 96-99. These rastering parameters are chosen to image the probes 24, 26, 28, 30 and the sample 36, while avoiding exposure of the sensitive region of the device structure 82 to the primary electron beam 25.

The controller 64 operates the raster control module 48 of the electron beam control unit 44 to implement the sub-regions 96-99 and the vector control module 50 of the electron beam control unit 44 to vector among the different sub-regions 96-99. The scan coils 14, 16, 18, are excited by voltages from the scan signal generator circuit 46 in the electron beam control unit 44 only at those addresses corresponding to the sub-regions 96-99 and to implement the vectors joining the sub-regions 96-99. Within each of the sub-regions 96-99, the scan coils 14, 16, 18, 20 are excited by voltages from the scan signal generator circuit 46 in the electron beam control unit 44 as instructed by the controller 64. The scan coils 14, 16, 18, 20 are not excited by voltages from the scan signal generator circuit 46 for those addresses corresponding to the masked region 91 other than during the vectoring between sub-regions 96-99.

In the representative embodiment, sub-region 96 is separated from sub-region 99 by the masked region 91 and, similarly, sub-region 97 is separated from sub-region 98 by the masked region 91. For each image frame, sub-region 96 is initially raster scanned by the primary electron beam 25, the primary electron beam 25 is vectored to a starting corner for sub-region 97, sub-region 97 is raster scanned, the primary electron beam 25 is vectored to a starting corner for sub-region 98, etc. Eventually, the primary electron beam 25 is vector scanned from the end position of sub-region 99 back to the starting corner for sub-region 96 to return to the beginning of the loop, and the next frame is initiated.

The image display control unit 40 and display buffer 54 are synchronized with the vectors and raster scans of the primary electron beam 25 on the sample 36. The vectors and raster scans for the primary electron beam 25 are continuously repeated or looped to continuously update the display buffer 54 with image data processed by the image display control unit 40. The secondary electron image 94 displayed on the video display unit 42 is refreshed by the display buffer 54 so that the secondary electron image 94 of the sub-regions 96-99 is displayed on the video display unit 42 with an appearance as shown in FIG. 3. The non-imaged region 92 is embedded inside the secondary electron image 94.

The controller 64 may optionally use the beam blanking control module 52 of the electron beam control unit 44 to blank the primary electron beam 25 as beam 25 is shifted from a vector end point to a vector start point. The beam blanking of portions of each of the vectors on the sample 36 that intersect the masked region 91 prohibits the primary electron beam 25 from entering the masked region 91.

Figure 5:
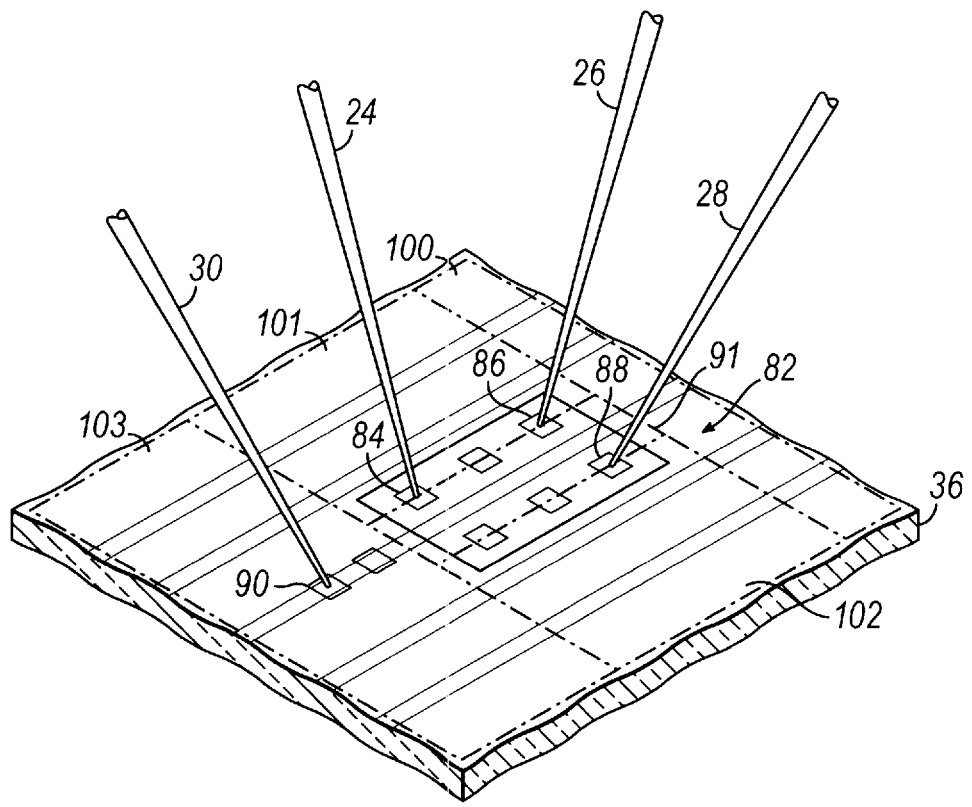
FIG. 5 is a diagrammatic view similar to FIG. 2 illustrating the use of sub-regions with individual raster scans of the primary electron beam on the sample to generate the secondary electron image of FIG. 3 in accordance with an alternative embodiment of the invention.
Figure 6:
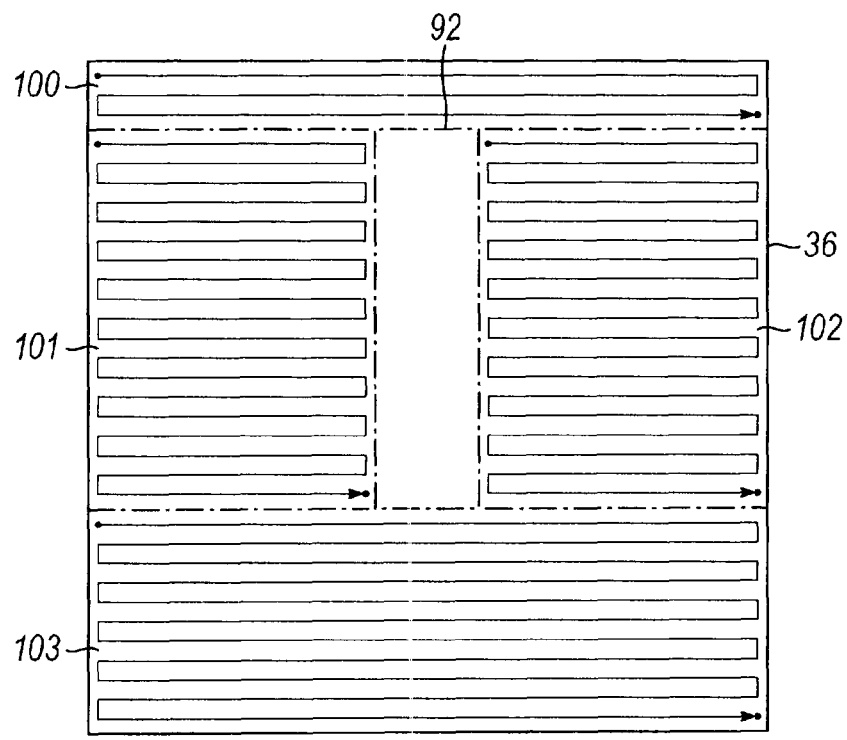
FIG. 6 is a schematic top view of the sample surface similar to FIG. 4 illustrating the raster scan lines for the individual sub-regions of FIG. 5.

With reference to FIGS. 5 and 6 and in accordance with an embodiment of the invention, the imaged surface area near the device structure 82 may be partitioned into rectangular sub-regions 100-103 that are raster scanned by the primary electron beam 25. The use of the sub-regions 100-103 may eliminate the need for beam blanking or operation of the beam blanking control module 52 of the electron beam control unit 44. The masked region 91 is defined to coincide with the sensitive region of the device structure 82, as in the embodiment of FIGS. 2, 3 and FIG. 4. The masked region 91 is then used by the controller 64 to define the boundaries for the sub-regions 100-103 that are necessary to image the probes 24, 26, 28, 30 and the field of view 75 on the sample 36, while avoiding exposure of the sensitive region of the device structure 82 to the primary electron beam 25.

The controller 64 determines a starting corner of the raster set for each of the sub-regions 100-103, a sweep rate (or a dwell and a step rate for incremental movement), an initial position of each scan line in the sub-regions 100-103, a terminal position of each scan line in the sub-regions 100-103, and a height for each of the sub-regions 100-103. The raster control module 48 of the electron beam control unit 44 is used by the controller 64 to implement the raster scans in the sub-regions 100-103 with an ordering that avoids exposing the masked region 91 to the primary electron beam 25. Within each of the sub-regions 100-103, the scan coils 14, 16, 18, 20 are excited by voltages from the scan signal generator circuit 46 in the electron beam control unit 44 under the control of the raster control module 48 and controller 64.

Raster boxes generated by the image display control unit 40 on video display unit 42 are spatially synchronized with the raster set of the primary electron beam 25 so that the secondary electron image 94 of the field of view 75 on the sample 36 is displayed on the video display unit 42. To that end, the raster scan lines of the video display unit 42 are partitioned by the image display control unit 40 and controller 64 into sub-regions corresponding to the sub-regions 100-103. The secondary electron image 94 displayed on the video display unit 42 has an appearance as depicted in FIG. 3 with the embedded non-imaged region 92 in image 94 corresponding to the masked region 91 within the field of view 75 on the sample 36.

For clarity in the secondary electron image 94, the sub-regions 100-103 in the raster set in the field of view 75 on the sample 36 may be looped at a relatively high scan rate. This permits a real time rendering on the video display unit 42 of the sample 36 over the field of view 75 and the tips of the probes 24, 26, 28, 30. Alternatively, the display buffer 54 may be used to acquire images and continuously refresh the secondary electron image 94 displayed on the video display unit 42. In this instance, writing image data to the display buffer 54 from the image display control unit 40 is synchronized with the raster scanned sub-regions 100-103 of the primary electron beam 25 across the field of view 75 on the sample 36.

The beam blanking control module 52 is omitted from use in this embodiment. Instead, the excitation voltages applied to the scan coils 14, 16, 18, 20 from the scan signal generator circuit 46 in the electron beam control unit 44, under the control of the controller 64, are used to generate a set of scan lines within each of the sub-regions 100-103. For example, all raster scan lines in sub-region 100 are swept before the raster scan lines in sub-region 101 are swept, all raster scan lines in sub-region 101 are swept before the raster scan lines in sub-region 103 are swept, and all raster scan lines in sub-region 103 are swept before the raster scan lines in sub-region 102 are swept.

Figure 7:
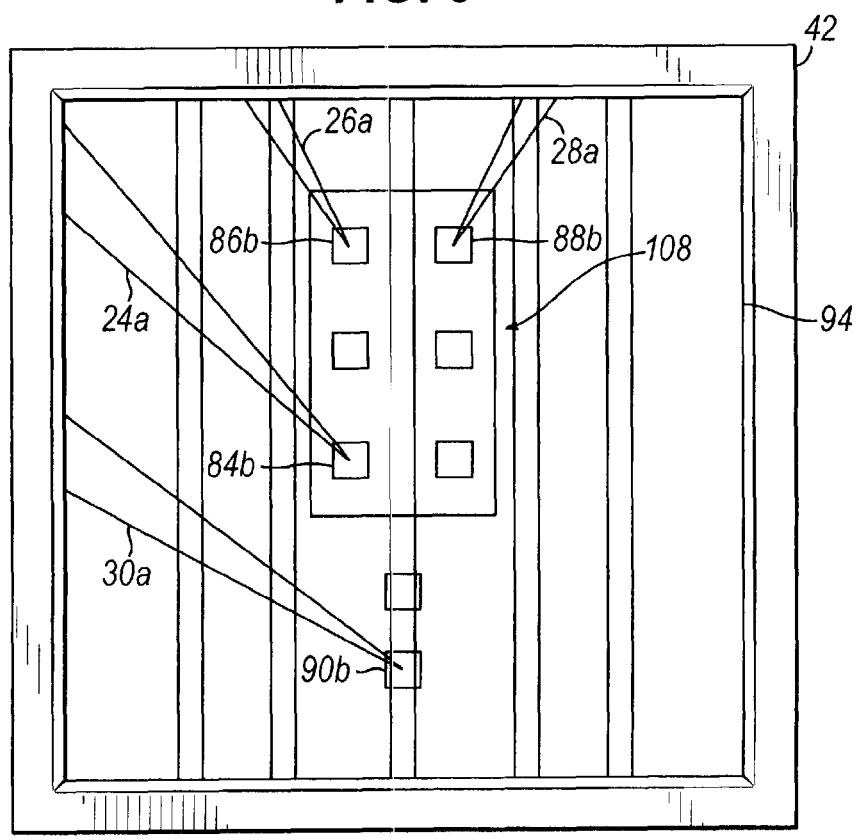
FIG. 7 is a diagrammatic view similar to FIG. 5 illustrating the use of a CAD layout in accordance with an alternative embodiment of the invention.

With reference to FIG. 7 and in accordance with an alternative embodiment of the invention, computer-aided design (CAD) layout and CAD navigation are utilized in conjunction with masking of the primary electron beam 25. The controller 64 initially causes the stage controller 34 to operate the sample stage 22 to align the probes 24, 26, 28, 30 with the sample 36 over a chip region remote from the targeted device structure 82. Because of the location selected for the initial alignment, the device structure 82 is not exposed to the primary electron beam 25. The CAD layout 108 for the targeted device structure 82 is overlaid or superimposed over the secondary electron image 94 of the probes 24, 26, 28, 30. The CAD layout 108 includes features that correspond to the device structure 82, including features 84b, 86b, 88b, 90b that correspond to the contacts 84, 86, 88, 90. The probes 24, 26, 28, 30 and CAD layout 108 are then aligned. The secondary electron image 94 is captured at a magnification corresponding to the final high magnification for the probing session. The masked region 91 is also defined for the device structure 82 at the final high magnification.

Next, the primary electron beam 25 is switched off so that secondary electron emission ceases from the sample 36. The controller 64 operates the stage controller 34 using CAD data to cause the sample stage 22 to move the sample 36 so the region about the device structure 82 will be exposed to the primary electron beam 25 when it is restored by the controller 64. Depending upon the resolution of the sample stage and the high magnification to be used for the probing session, the instrument magnification is set at a magnification closest to the final high magnification yet at which it can be assured the targeted device structure 82 will be within the field of view when the primary electron beam 25 is switched on. In one embodiment, the accuracy of the CAD navigation using the CAD data may approach or exceed 50 nanometers.

The probing session is then initiated. The primary electron beam 25 is switched on and the field of view 75 on the sample 36 is imaged at the high magnification. The instantaneous presence of the masked region 91, which is programmed ahead of time as explained above, protects the sensitive region of the device structure 82 against exposure to the primary electron beam 25. After secondary electron imaging is initiated, the placement of the sample 36 under the probes 24, 26, 28, 30 and masked region 91 is fine tuned, if required, as swiftly as possible. The probes 24, 26, 28, 30 are lowered to the contacts 84, 86, 88, 90 and the device electrical measurement is executed without ever exposing the masked region 91 on the sample 36 to the primary electron beam 25. The probes 24, 26, 28, 30 may be monitored for pressure build up and/or lateral movement during the probing session by keeping the beam 25 on.

Figure 8:
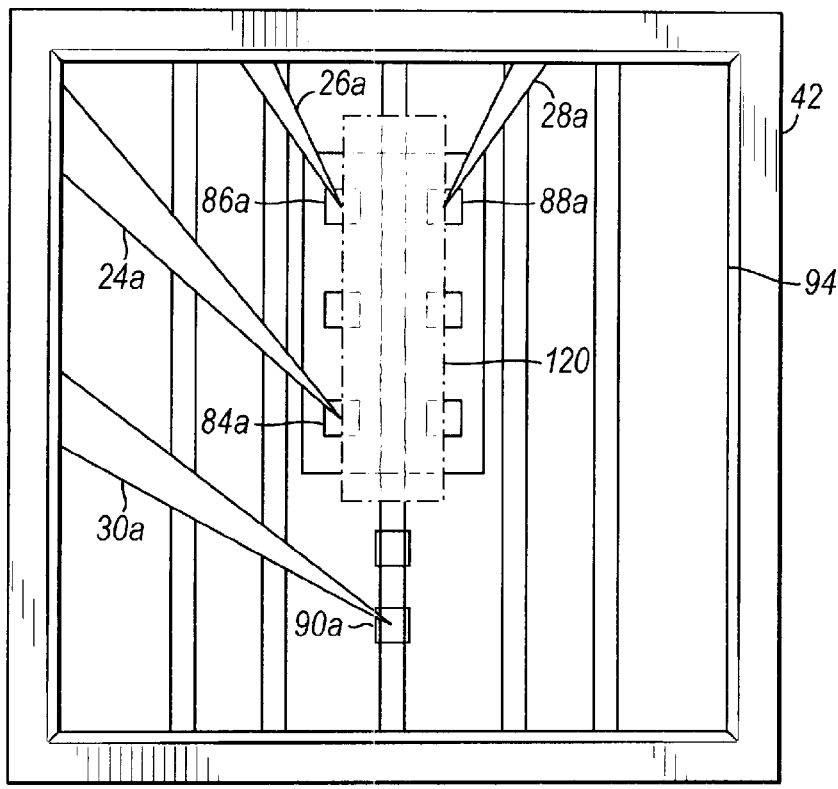
FIG. 8 is a diagrammatic view similar to FIG. 4 of a secondary electron image of the device structure of FIG. 2 generated using differential raster rates in accordance with an alternative embodiment of the invention.
Figure 9:
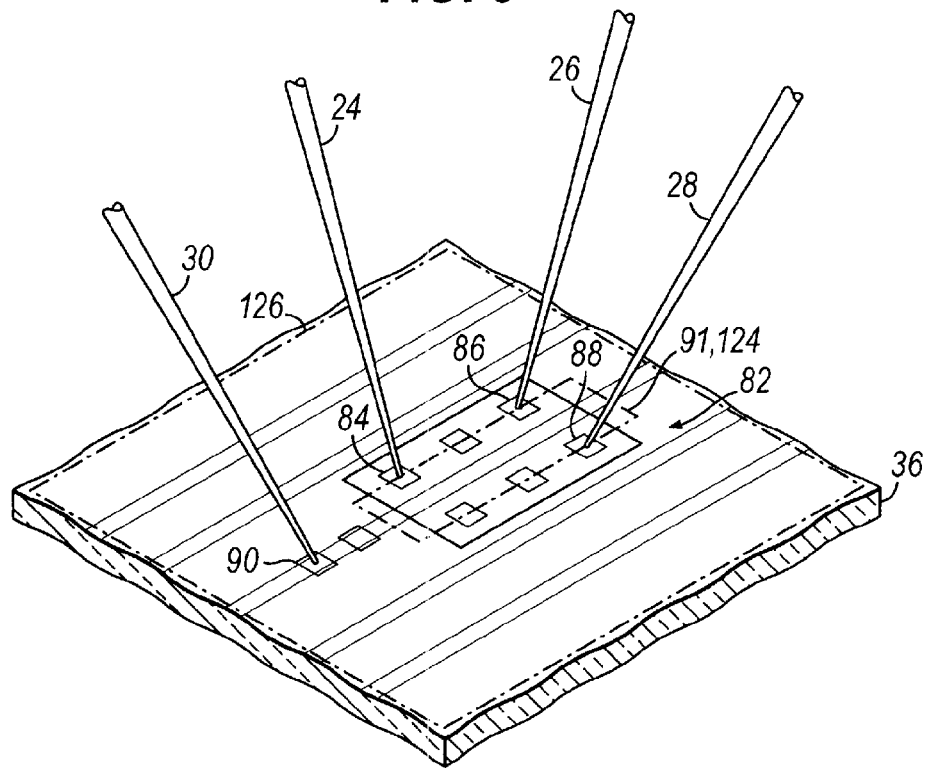
FIG. 9 is a diagrammatic view similar to FIG. 2 illustrating the use of differential raster rates for the primary electron beam on the sample to generate the secondary electron image of FIG. 8.

With reference to FIGS. 8 and 9 and in accordance with an embodiment of the invention, differential raster scan rates for the primary electron beam 25 are applied to reduce the electron dose delivered to the sensitive region of the device structure 82 during a probing session. The primary electron beam 25 is scanned within a field of view 126 under the direction of the controller 64 and electron beam control unit 46 at a relatively fast rate in a raster box 124. The raster box 124 is registered spatially with the masked region 91 on the sample 36. The remainder of the field of view 126 on the sample 36 is scanned by the primary electron beam 25 under the direction of the controller 64 and electron beam control unit 46 at a relatively slow scan rate that is significantly less than the fast scan rate. The slow and fast scan rates by be established by different dwell settings at each imaged point for the primary electron beam 25. The probes 24, 26, 28, 30 and the surface of the sample 36 may be imaged in the secondary electron image 94 during the electrical measurement.

The secondary electron image 94 rendered by the image display control unit 40 on the video display unit 42 is synchronized with the primary electron beam 25. The instrument user employs the user interface 74, the controller 64, and the secondary electron image 94 acquired from the sample 36 to define a high-speed raster box 124 linked with the masked region 91 on the sample 36. The length and height of the high-speed raster box 124 is defined by the user by setting parameters used by the raster control module 48 of the electron beam control unit 44. Based upon the user settings, the controller 64 provides instructions from the raster control module 48 to the scan signal generator circuit 46 in the electron beam control unit 44 to implement the high-speed raster box 124 inset within the secondary electron image 94. For each raster scan line, the dwell time of the primary electron beam 25 at any point is slower outside of the high-speed raster box 124 than within the outer perimeter of high-speed raster box 124.

The high-speed raster box 120, which corresponds to the high-speed raster box 124 on the sample 36, appears in the secondary electron image 94. Objects in the high-speed raster box 120 are appears translucent (or with a poorer resolution) in the secondary electron image 94 and the image quality outside of the high-speed raster box 120 is at a relatively high resolution. The instrument user can visualize and monitor the probes 24, 26, 28, 30 at the points of contact in the high-speed raster box 120 of the secondary electron image 94. The slow-speed imaging of the probes 24, 26, 28, 30 outside the high-speed raster box 120 will permit the user to clearly view images of the shanks of the probes 24, 26, 28, 30 to determine if any pressure has built up. The scan rate of the primary electron beam 25 in the high-speed raster box 124 on the sample 36 can be adjusted to be 150%, 200%, 500%, etc., or some other user-defined percentage of the scan rate for the rest of the field of view 126 on the sample 36.

In an alternative embodiment, the high-speed raster box 124 may have a masked region (not shown) that receives no exposure to the primary electron beam 25 and that is inset within the field of view 126. The slow scan is performed with this masked region followed by a fast scan in the high-speed raster box 124. This combination of scans is looped or cycled, the display buffer 54 is used to capture scans, and the secondary electron image 94 on the video display unit 42 is refreshed from the display buffer 54.

In other alternative embodiments of the invention, the various approaches described hereinabove may be applied in combination to minimize the electron dose delivered to the device structure 82 exposed to the primary electron beam 25 during the probing session. For example, sub-regions for raster scanning, as described in connection with FIGS. 5 and 6, and the masked raster scan approach of FIGS. 2 and 3 may be used in combination with each other. The low magnification scans reference herein may be performed at accelerating voltages and/or beam currents that are reduced in comparison with the high magnification scans, regardless of whether raster scanning, vector scanning, or both are utilized for imaging. While electron beam irradiation and imaging are described as being performed during device electrical measurements to monitor the probes 24, 26, 28, 30, one could forfeit monitoring the probes 24, 26, 28, 30 and turn off the primary electron beam 25 during measurements.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. Furthermore, to the extent that the terms "includes", "having", "has", "with", or variants thereof are used in either the detailed description or the claims, such terms are intended to be inclusive in a manner similar to the term "comprising." It is also understood that features of the embodiments of the invention are not necessarily shown to scale in the drawings.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A method for nanoprobing a device structure on a sample using at least one probe, the device structure including a contact and a sensitive region, the method comprising:

positioning the at least one probe relative to a first region of the device structure including at least a portion of the contact and a second region of the device structure including the sensitive region;

scanning a primary electron beam across the first region of the device structure and the at least one probe;

masking the second region from exposure to the primary electron beam as the primary electron beam is scanned across the first region to protect the sensitive region of the device structure while imaging the non-masked portion of the contact;

collecting secondary electrons emitted from the first region of the device structure and the at least one probe to form a secondary electron image in which the at least one probe appears as a first imaged portion of the secondary electron image, the first region of the device structure appears as a second imaged portion of the secondary electron image, and the second region of the device structure appears as a shadow in the secondary electron image that is embedded within the second imaged portion;

while forming the secondary electron image including the first and second imaged portions, contacting the at least one probe with the contact; and while forming the secondary electron image including the first and second imaged portions, directing electrical test signals from the at least one probe to the contact to acquire an electrical measurement.

2. The method of claim 1 wherein masking the second region further comprises:
blanking the primary electron beam for scanned positions on the sample within the second region to prohibit the primary electron beam from impinging the second region.

3. The method of claim 2 wherein blanking the primary electron beam further comprises:
applying a voltage to one or more deflection plates effective to deflect the primary electron beam to impinge an aperture stop upstream from the sample.

4. The method of claim 1 wherein scanning the primary electron beam further comprises:
raster scanning the primary electron beam relative to the sample as a plurality of scan lines.

5. The method of claim 4 further comprising:
blanking the primary electron beam for scanned positions on the sample within the second region to prohibit the scan lines from entering the second region.

6. The method of claim 1 wherein scanning the primary electron beam across the first region further comprises:
moving the primary electron beam on the sample in a plurality of vector scan lines confined within the first region.

7. The method of claim 6 further comprising:
displaying the secondary electron image on a video display unit; and
using a display buffer to synchronize the secondary electron image displayed on the video display unit with the vector scan lines of the primary electron beam.

8. The method of claim 1 wherein masking the second region further comprises:
dividing the first region into a plurality of rectangular sub-regions on the sample; and
for each of the rectangular sub-regions, raster scanning the primary electron beam relative to the sample as a plurality of raster scan lines.

9. The method of claim 8 further comprising:
displaying the secondary electron image on a video display unit; and
synchronizing raster scan lines on the video display unit with the raster scan lines in each of the rectangular sub-regions.

10. The method of claim 8 wherein moving the primary electron beam on the sample in a plurality of vectors such that the raster scan lines of each of the rectangular sub-regions starts at an end point of one of the vectors and ends at a start point of another of the vectors.

11. The method of claim 10 wherein masking the second region further comprises:
blanking the primary electron beam for portions of each of the vectors on the sample that intersect the second region so that the primary electron beam is prohibited from impinging the second region during the raster scanning.

12. The method of claim 10 further comprising:
displaying the secondary electron image on a video display unit; and
synchronizing vectors and raster scan lines on the video display unit with the vectors and the raster scan lines of the primary electron beam.

13. The method of claim 1 further comprising:
forming the secondary electron image, monitoring the at least one probe in the secondary electron image for deformation of a shank of the at least one probe or lateral movement of a tip of the at least one probe relative to the contact.

14. The method of claim 1 further comprising:
displaying the secondary electron image on a video display unit; and
synchronizing scan lines on the video display unit with the scanning of the primary electron beam.

15. The method of claim 1 wherein positioning the at least one probe relative to the first region of the device structure including the portion of the contact and the second region of the device structure further comprises:
positioning the at least one probe relative to the first region and the second region using a computer-aided design (CAD) layout of the device structure; and
using CAD navigation data, moving the sample relative to the at least one probe so that the first region of the device structure is positioned relative to the at least one probe before the primary electron beam is scanned across the first region of the device structure.

16. The method of claim 15 wherein positioning the at least one probe relative to the first region of the device structure including the portion of the contact and the second region further comprises:
at a location on the sample remote from the device structure, acquiring another secondary electron image of the at least one probe;
superimposing the CAD layout of the device structure over the secondary electron image of the at least one probe acquired at the location on the sample remote from the device structure; and
positioning the at least one probe relative to the CAD layout.

17. The method of claim 15 further comprising:
defining boundaries for the second region relative to the CAD layout of the device structure.

18. A method for nanoprobing a device structure on a sample using at least one probe, the device structure including a contact and a sensitive region, the method comprising:
positioning the at least one probe relative to a first region of the device structure including at least a portion of the contact and a second region of the device structure including the sensitive region;

scanning a primary electron beam across the first region of the device structure at a first scan rate;

scanning the primary electron beam across the second region of the device structure at a second scan rate faster than the first scan rate to protect the sensitive region while imaging the non-masked portion of the contact;

collecting secondary electrons emitted from the first and second regions and the at least one probe to form a secondary electron image in which the at least one probe appears as a first imaged portion of the secondary electron image, the first region of the device structure appears as a second imaged portion of the secondary electron image, and the second region of the device structure appears as a shadow in the secondary electron image that is embedded within the second imaged portion;

while forming the secondary electron image including the first and second imaged portions, contacting the at least one probe with the contact; and while forming the secondary electron image including the first and second imaged portions, directing electrical test signals from the at least one probe to the contact to acquire an electrical measurement.

19. The method of claim 18 further comprising:

displaying the secondary electron on a video display unit; and synchronizing raster scan lines on the video display unit with the scanning of the primary electron beam.

20. The method of claim 18 wherein an intensity of the secondary electrons per unit area emitted from the second region is less than an intensity of the secondary electrons per unit area emitted from the first region such that the first region is displayed in the secondary electron image with a higher resolution than the second region.

21. The method of claim 1 wherein the primary electron beam is scanned in a pattern to image the portion of the contact, and masking the second region from exposure to the primary electron beam comprises:

electronically controlling the pattern in which the primary electron beam is scanned in order to mask the second region from exposure to the primary electron beam and thereby protect the sensitive region of the device structure.

* * * * *